(12) United States Patent
Sabens et al.

(10) Patent No.: US 11,214,871 B2
(45) Date of Patent: Jan. 4, 2022

(54) CHEMICAL VAPOR DEPOSITION REACTOR TO GROW DIAMOND FILM BY MICROWAVE PLASMA CHEMICAL VAPOR DEPOSITION

(71) Applicant: II-VI Delaware, Inc., Wilmington, DE (US)

(72) Inventors: David Sabens, Harmony, PA (US); Charles D. Tanner, Saxonburg, PA (US); Elgin E. Eissler, Renfrew, PA (US)

(73) Assignee: II-VI DELAWARE, INC., Wilmington, DE (US)

( * ) Notice: Subject to any disclaimer, the term of this patent is extended or adjusted under 35 U.S.C. 154(b) by 181 days.

(21) Appl. No.: 16/387,042

(22) Filed: Apr. 17, 2019

(65) Prior Publication Data
US 2019/0242016 A1    Aug. 8, 2019

Related U.S. Application Data

(62) Division of application No. 15/447,300, filed on Mar. 2, 2017, now Pat. No. 10,280,511.
(Continued)

(51) Int. Cl.
| | | |
|---|---|---|
| *C23C 16/511* | (2006.01) |
| *C23C 16/27* | (2006.01) |
| *C30B 29/04* | (2006.01) |
| *C23C 16/455* | (2006.01) |
| *C30B 25/00* | (2006.01) |

(Continued)

(52) U.S. Cl.
CPC .......... *C23C 16/511* (2013.01); *C23C 16/274* (2013.01); *C23C 16/4558* (2013.01); *C23C 16/45504* (2013.01); *C30B 25/00* (2013.01); *C30B 29/04* (2013.01); *C30B 35/00* (2013.01); *H01J 37/32* (2013.01);
(Continued)

(58) Field of Classification Search
CPC ... C23C 16/511; C23C 16/27; H01J 37/32642
See application file for complete search history.

(56) References Cited

U.S. PATENT DOCUMENTS

| | | |
|---|---|---|
| 6,132,550 A | 10/2000 | Shiomi |
| 2014/0308461 A1 | 10/2014 | Cullen et al. |

(Continued)

FOREIGN PATENT DOCUMENTS

| | | |
|---|---|---|
| GB | 2486783 A | 6/2012 |
| JP | 10172954 A | 6/1998 |

*Primary Examiner* — Joseph A Miller, Jr.
(74) *Attorney, Agent, or Firm* — Blank Rome LLP

(57) ABSTRACT

A chemical vapor deposition (CVD) reactor includes a resonating cavity configured to receive microwaves. A microwave transparent window positioned in the resonating cavity separates the resonating cavity into an upper zone and a plasma zone. Microwaves entering the upper zone propagate through the microwave transparent window into the plasma zone. A substrate is disposed proximate a bottom of the plasma zone opposite the microwave transparent window. A ring structure, positioned around a perimeter of the substrate in the plasma zone, includes a lower section that extends from the bottom of the resonating cavity toward the microwave transparent window and an upper section on a side of the lower section opposite the bottom of the resonating cavity. The upper section extends radially toward a central axis of the ring structure. An as-grown diamond film on the substrate is also disclosed.

30 Claims, 12 Drawing Sheets

Related U.S. Application Data

(60) Provisional application No. 62/304,518, filed on Mar. 7, 2016.

(51) Int. Cl.
  *C30B 35/00* (2006.01)
  *H01J 37/32* (2006.01)

(52) U.S. Cl.
  CPC .. *H01J 37/32192* (2013.01); *H01J 37/32229* (2013.01); *H01J 37/32238* (2013.01); *H01J 37/32642* (2013.01)

(56) References Cited

U.S. PATENT DOCUMENTS

| | | |
|---|---|---|
| 2014/0339684 A1 | 11/2014 | Mollart |
| 2015/0222087 A1 | 8/2015 | Williams et al. |

CHEMICAL VAPOR DEPOSITION REACTOR TO GROW DIAMOND FILM BY MICROWAVE PLASMA CHEMICAL VAPOR DEPOSITION

CROSS REFERENCE TO RELATED APPLICATION

This application is a divisional of U.S. patent application Ser. No. 15/447,300, filed on Mar. 2, 2017, which claims the benefit of U.S. Provisional Patent Application No. 62/304,518, filed Mar. 7, 2016, the contents of which are incorporated herein in their entirety by reference.

BACKGROUND OF THE INVENTION

Field of the Invention

The present invention relates to a chemical vapor deposition reactor and, more particularly, to a ring structure that focuses microwaves in the reactor to facilitate growth of a diamond film on a growth substrate. The present invention is also directed to a method of using the chemical vapor deposition reactor.

Description of Related Art

Polycrystalline diamond films have long been recognized for their unique combination of optical properties. Its low absorption of 10.6 um and 1 um wavelengths makes it an ideal material for use in windows transparent to a range of wavelengths with applications such as advanced photolithographic patterning techniques. In addition to near IR and mm wave transparency, polycrystalline diamond films have extraordinarily high thermal conductivity (sometimes exceeding 2000 W/mK), low thermal expansion coefficient, microwave transparency, and extreme hardness. These properties and more make it a valuable material for a variety of applications.

Presently, polycrystalline diamond films are grown on the industrial scale using a technique called Chemical Vapor Deposition (CVD). Examples of CVD reactors for diamond include: hot filament, DC arc jet, flame, and microwave plasma.

To achieve the highest quality diamond in terms of optical, microwave and nuclear detector performance, microwave plasma CVD (MPCVD) is commonly employed. For MPCVD growth, a growth substrate (typically made of W, Mo or Si) is loaded into the bottom of MPCVD growth chamber. A microwave plasma is generated within the growth chamber flowing a reactive gas mixture of $H_2$ with ~0.1-5% $CH_4$. The substrate is heated to a temperature generally ranging from ~700-1200 C at a reactive gas pressure of ~10-250 Torr. Within this range of conditions, diamond is a metastable material that, due to differences in density, is preferentially deposited on the growth substrate. The microwave plasma generates chemical precursors necessary for diamond deposition reactions to take place on the growth substrate surface.

One major drawback of MPCVD is the dimensional limitations of the growth chamber. Common chamber designs are limited as a function of one-half of one wavelength of the excitation microwave frequency. One option to expand the size of the resonant chamber is to reduce the frequency of the incoming microwaves. However, there are significant regulatory barriers associated with frequency selection. Another option to expand the substrate size available for diamond growth would be to introduce specialized features inside the growth chamber.

There are diamond growth chambers known in the art that employ plasma control techniques including, for example, a focusing ring protruding from the sidewall (US 2014/0308461), and freestanding rings surrounding the growth substrate and control of growth substrate sidewalls. (US 2014/0339684).

To date, no MPCVD growth chamber design allows for substrate diameters that are significantly larger than one-half of one wavelength of the excitation microwave frequency. In addition, these MPCVD growth chamber designs are limited in versatility. Due to the nature of their construction, typical MPCVD growth chambers accommodate a limited number of growth substrates. This limits the size and shape of growth substrates in any given growth chamber and modification requires significant monetary and design cost.

SUMMARY OF THE INVENTION

Disclosed herein is a variety of ring structures, having interchangeable features, and growth substrates that can be used within the same MPCVD growth chamber. This dramatically expands the versatility of the MPCVD growth chamber.

More specifically, disclosed herein are a number of focusing ring-structures, including a number of interchangeable features, that can be fixed to a bottom of an MPCVD chamber. The focusing ring-structures can include internal cooling channels and/or gas flow channels which mate with corresponding channels on the MPCVD chamber bottom providing customizability of the MPCVD chamber design. The cooling channels of the focusing ring structures can be independent of cooling channels at the bottom of the MPCVD chamber and gas channels that can be used to provide processes gasses into both the reaction space (typically $H_2$, $CH_4$ and Ar) and purge (typically Ar) allowing control of the reaction zone.

Given the modular nature of the focusing ring-structures disclosed herein, a variety of designs can be used, each addressing specific design problems (e.g. varying diameter sizes, center-to-edge stress differences, and curved surfaces).

DESCRIPTION OF THE INVENTION

Figure 1:
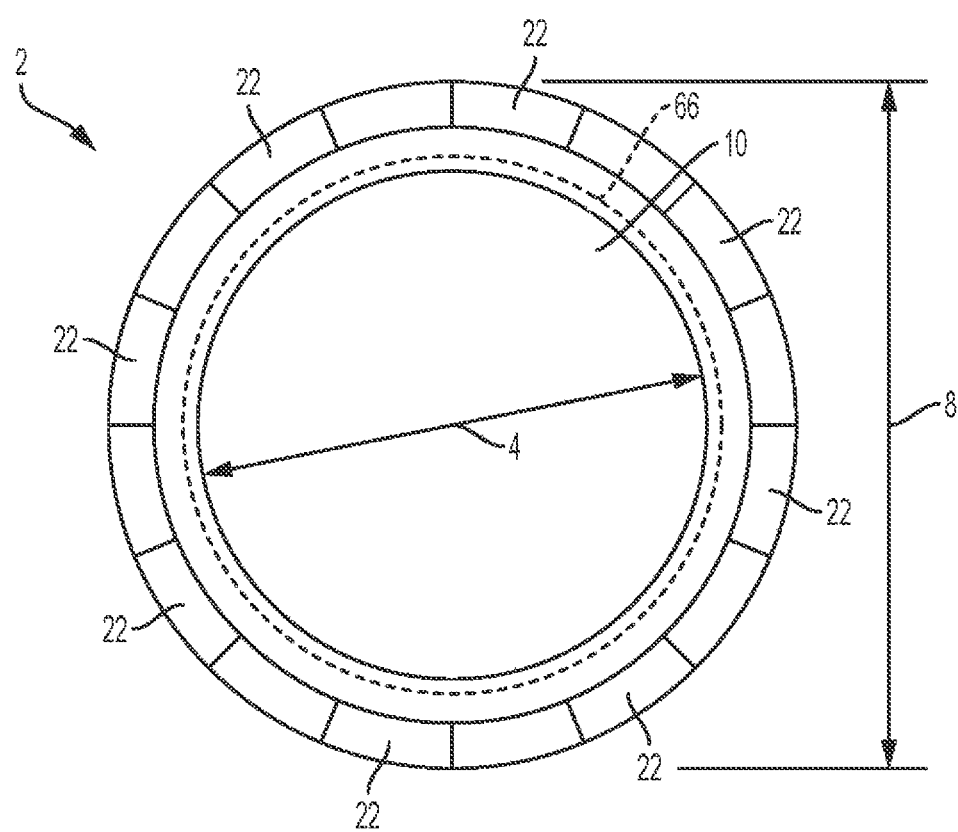
FIG. 1 is a bottom-up view of an example focusing ring structure taken along lines I-I in FIG. 2.

Various non-limiting examples will now be described with reference to the accompanying figures where like reference numbers correspond to like or functionally equivalent elements.

Scope of Impacted Materials:

PCVD diamond films can be single crystalline or polycrystalline. Through minor changes in a MPCVD growth process, polycrystalline diamond films can be used in a range of applications including, for example: high quality, low absorption optical windows; high thermal conductivity thermal management films; electronic and electrochemical components through the incorporation of boron doping; and ultra-high purity diamond films for nuclear detector systems.

The example ring structures described herein can be used to extend the plasma zone for all of these diamond growth applications and others. The three major frequencies used today for diamond growth are 2.45 GHz ($\lambda$=122.4 mm), 915 MHz ($\lambda$=328 mm), and 433 MHz ($\lambda$=693 mm). Typical of diamond films diameters grown at these frequencies include ≤60 mm, ≤160 mm, and ≤340 mm, respectively. In the examples described herein, these growth diameter can be extended to 100 mm, 275 mm, and 580 mm or more, respectively. With increased growth diameter comes a significant reduction in processing costs. Herein, "$\lambda$" is a wavelength of the microwave frequency being used for diamond film growth in a MPCVD chamber that is configured for use at said wavelength.

Modular Focusing Ring Structure:

With reference to FIGS. 1-3(A) and 7, an example ring structure 2 in accordance with the principals described herein can be initially developed in a mathematical modelling suite used to generate a favorable resonant eigenmode in an MPCVD chamber 20 at a desired microwave frequency that corresponds with the resonant frequency of the microwave source, e.g., a magnetron, used to form a plasma 70 in the MPCVD chamber 20.

In an example, ring structure 2 can include an upper, ring-shaped section 14 including an inner diameter 4 that can vary from $5/8\lambda$ to $3/4\lambda$, a thickness 6 that can vary from $1/8\lambda$ to $3/16\lambda$, and an outer diameter 8 that can vary from $1\pm1/8\lambda$. In an example, a diameter 12 of growth substrate 10 can vary from $3/4\lambda$ to $7/8\lambda$.

Figure 2:
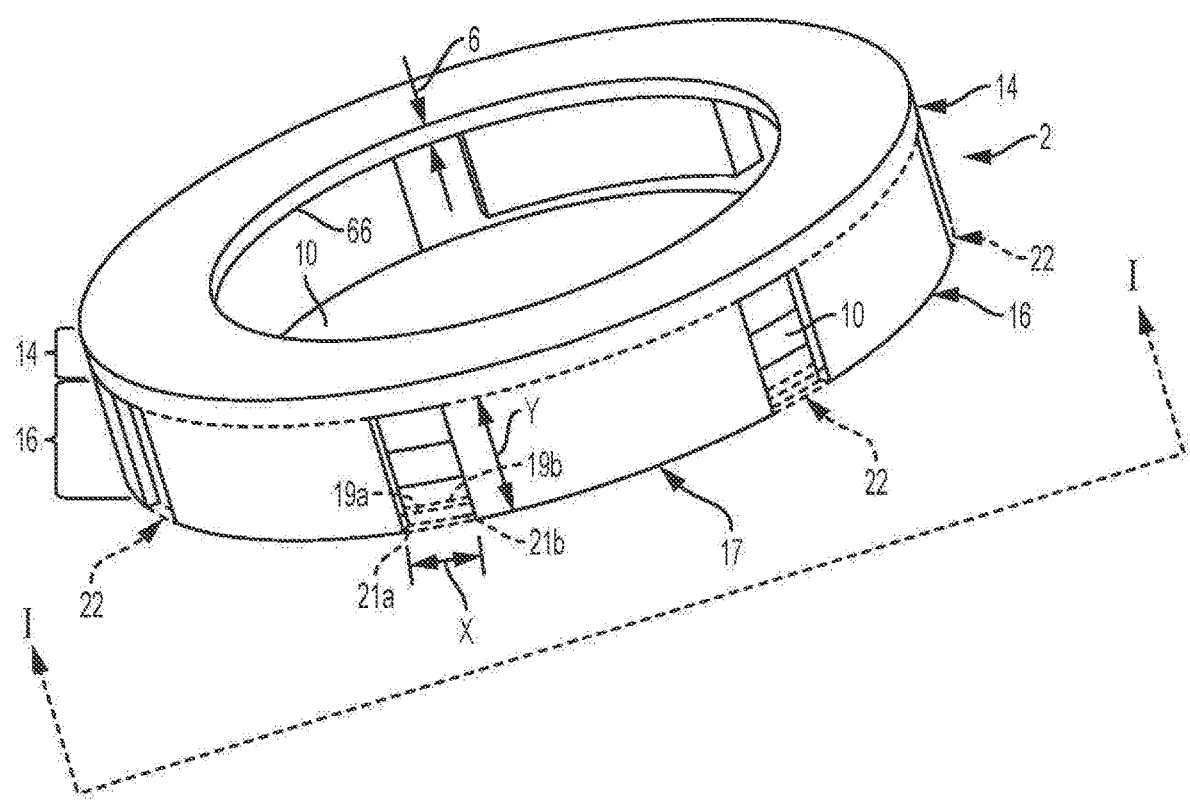
FIG. 2 is a perspective view of the example focusing ring structure shown in FIG. 1.
Figure 7:
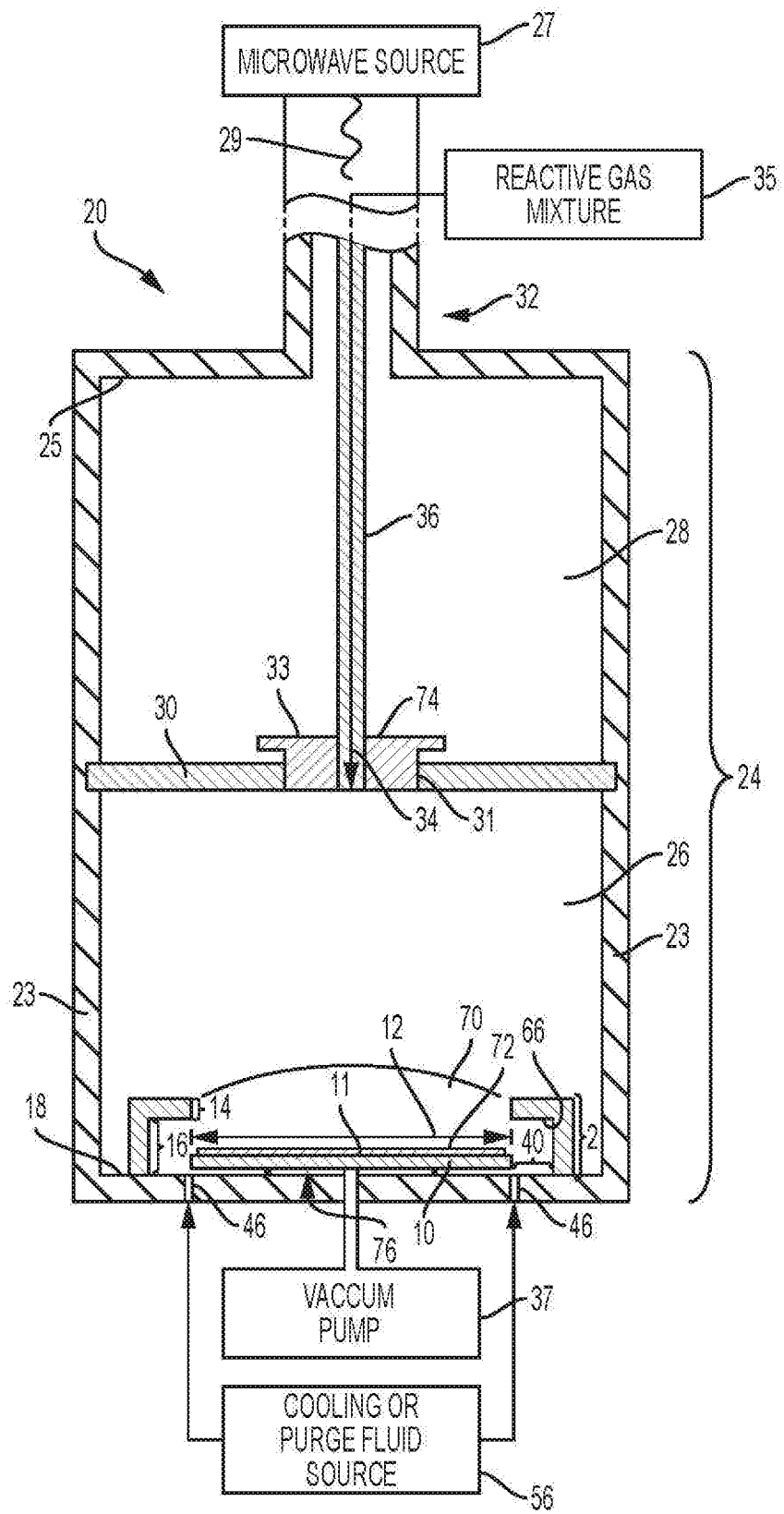
FIG. 7 is a schematic cross-section of an MPCVD reactor comprising an MPCVD chamber including the example ring structure shown in FIGS. 1 and 2.

As shown, for example, in FIG. 7, lower, ring-shaped vertical section 16 extends upwardly $1/8\lambda$ from a bottom 18 of MPCVD chamber 20, has an inside diameter of $7/8\pm1/8\lambda$, and an outside diameter of $1\pm1/8\lambda$. Lower, vertical section 16 supports a bottom side 66 of upper section 14 spaced from the bottom 18 of MPCVD chamber 20. In an example, one side of ring structure 2 shown in FIG. 3(A) can appear as "T" in cross-section. FIGS. 1 and 2 show bottom-up and perspective views of ring structure 2 and growth substrate 10. In an example, any example ring structure 2 described herein and growth substrate 10 can be (and are desirably) positioned coaxially within MPCVD chamber 20 proximate bottom 18. MPCVD chamber 20 includes a sidewall 23 that surrounds ring structure 2 and extends upwards from bottom 18 to a top 25 of MPCVD chamber 20.

Figure 3A:
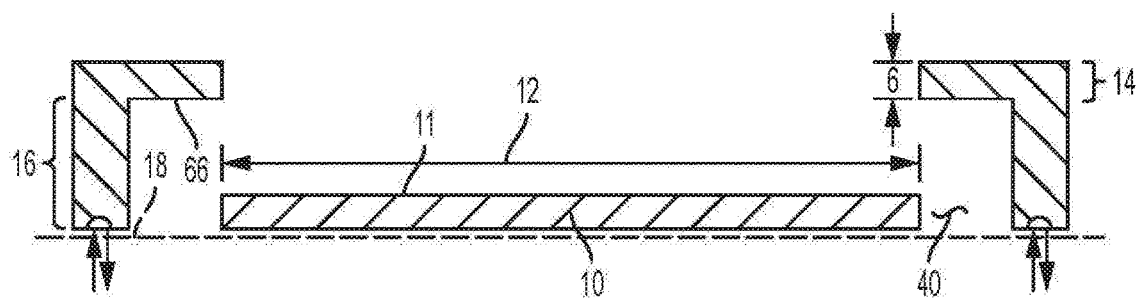
FIG. 3(A) is a cross-section of the example focusing ring structure shown in FIGS. 1 and 2.

FIGS. 3(A)-3(D) show a basic ring structure 2 (FIG. 3(A)) described above and other example ring structures (FIGS. 3(B)-3(D)) described further hereinafter.

Figure 4A:
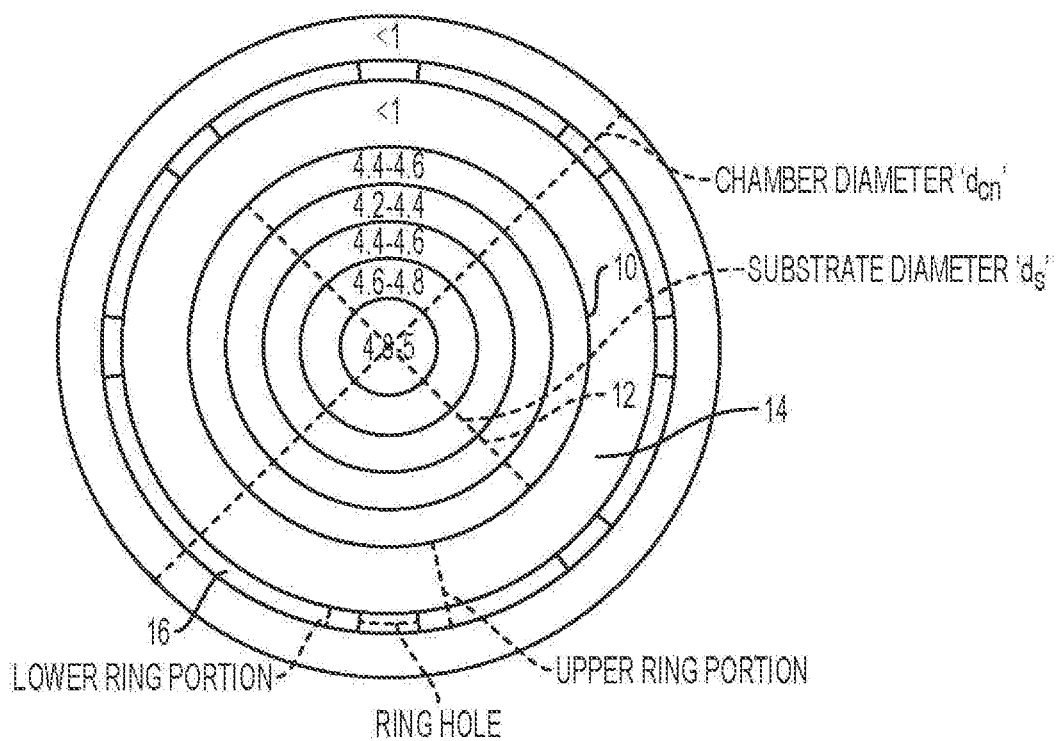
FIG. 4(A) is an electric field contour plot (with normalized units) 1 mm above an upward facing surface of a growth substrate in a MPCVD chamber that includes the ring structure shown in FIGS. 1 and 2.
Figure 4B:
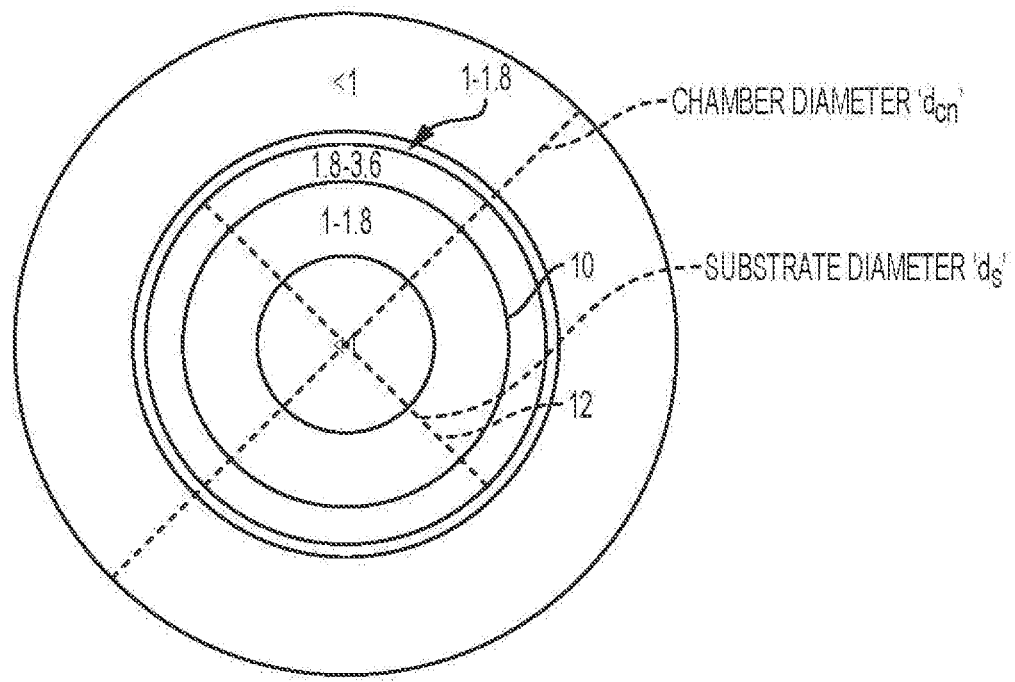
FIG. 4(B) is an electric field plot (with normalized units) 1 mm above the upward facing surface of a growth substrate in a MPCVD chamber without a ring structure installed.

FIGS. 4(A)-4(B) show electric field contour plots (with arbitrary normalized units) of two identical MPCVD chambers 1 mm above an upward facing surface 11 of growth substrate 10. FIG. 4(A) is an electric field contour plot of an MPCVD chamber 20 that includes ring structure 2 shown in FIG. 3(A) and FIG. 4(B) is an electric field contour plot of an MPCVD chamber 20 without a ring structure installed. As can be seen, the electric fields are dramatically different, where the addition of the ring structure 2 (FIG. 4(A)) yields a more uniform field of higher intensity above growth substrate 10 and a relatively weak electric field away from growth substrate 10. The uniform electric field distribution resulting from the addition of ring structure 2 results in a highly uniform plasma 70 forming over the extent of a growth area of growth substrate 10 where diamond film growth occurs while avoiding or eliminating parasitic plasmas forming elsewhere within MPCVD chamber 20.

Referring back to FIG. 2, in an example, lower section 16 of ring structure 2 can include holes or slots 22 at intervals around lower section 16. The number, width (x), height (y), and vertical position of each hole or slot 22 can be tuned to target a desired frequency for a desired eigenmode within MPCVD chamber 20. These holes or slots 22 need not be axisymmetric. Indeed, in some cases, axial symmetry may not be desired.

In the example shown in FIG. 2, each hole or slot 22 extends from upper section 14 to a bottom 17 of lower section 16 where said hole or slot 22 is open. However, each hole or slot 22 need not reach and open at bottom 17 of lower section 16. This is shown by dashed lines (19a, 19b) and (21a, 21b) in FIG. 2 which represent, in-phantom, a solid part of lower section 16. Rather, each hole or slot 22 can extend between upper section 14 and intermediate bottom 17 of lower section 16, e.g., terminating at the level of dashed lines (19a, 19b). In addition, each hole or slot 22 does not necessarily need to be square, as shown in FIG. 2 for ease of explanation. For the purpose of description herein, unless otherwise shown or indicated, it will be assumed that each hole or slot 22 opens at bottom 17 of lower section 16.

Figure 5:
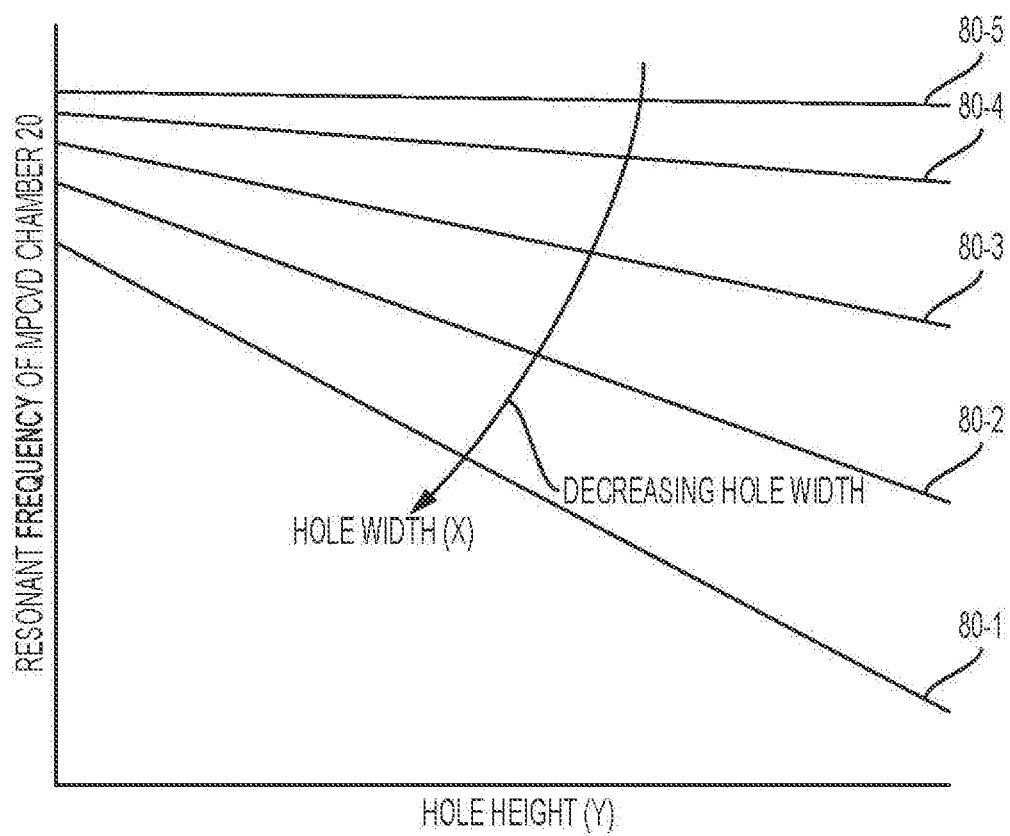
FIG. 5 is a plot of resonant frequency of an MPCVD chamber including the ring structure shown in FIGS. 1 and 2 versus the x and y dimensions of each hole in the lower section of said ring structure.

FIG. 5 shows the effect on the resonant frequency of MPCVD chamber 20 by varying the width (x) and height (y) of sixteen regularly spaced holes of ring structure 2. In FIG. 5, each plot (or line) 80-1-80-5 was obtained from a ring structure 2 having holes 2 with the same x and y dimensions. For example, plot 80-1 is for a ring structure having holes 22 each of which has a first set of x and y dimensions; plot 80-2 is for a ring structure including holes 22 having a second set of x and y dimensions, and so forth. As shown, both the x and y dimensions of each hole 22 can be used to control the resonant frequency of MPCVD chamber 20.

Figure 6:
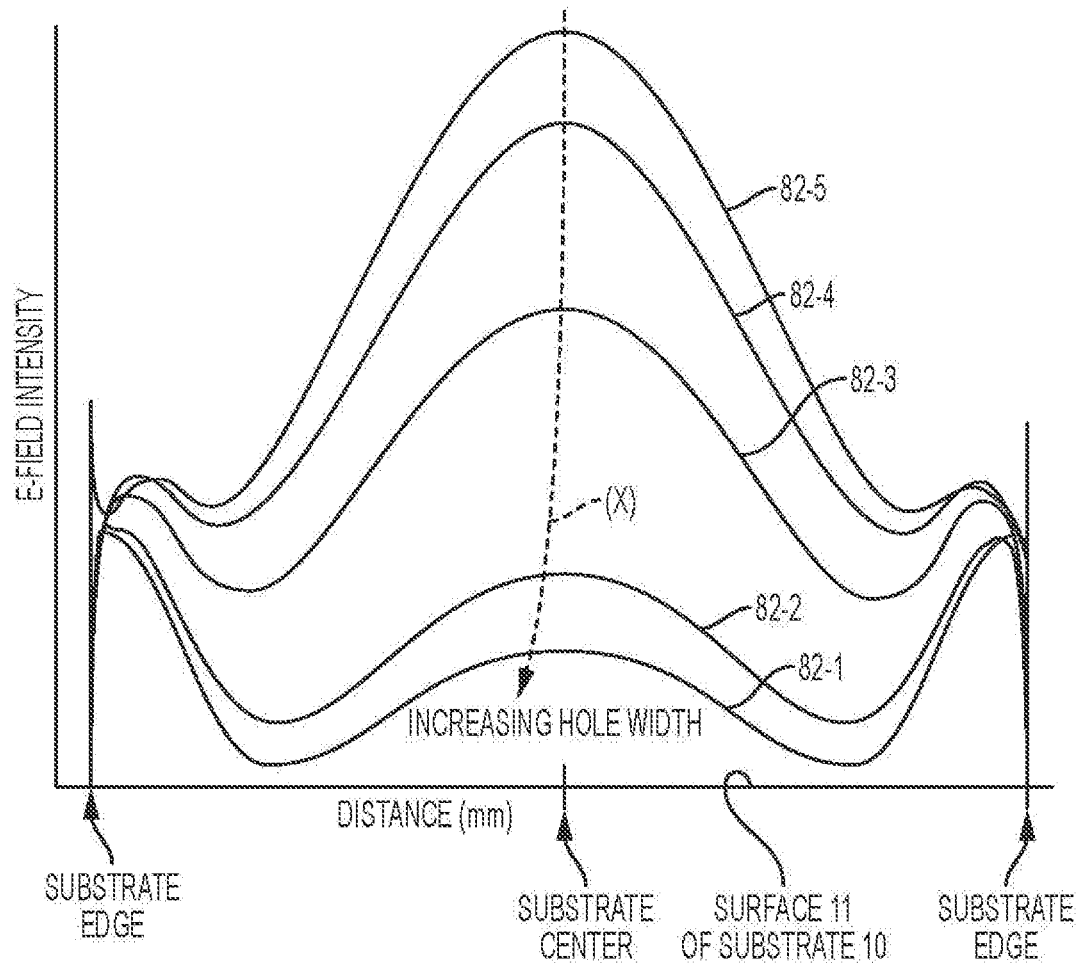
FIG. 6 is a plot of electric field intensity 1 mm above the surface of the growth substrate versus the width (x) of each hole in the lower section of the ring structure shown in FIGS. 1 and 2.

FIG. 6 shows the impact of different x dimensions (width) of holes 22 on a cross-section of the electric field 1 mm above surface 11 of growth substrate 10. In FIG. 6, each plot (or line) 82-1-82-5 was obtained from a ring structure 2 having holes 22 with the same x and y dimensions. For example, plot 82-1 is for a ring structure having holes 22 each of which has a first set of x and y dimensions; plot 82-2 is for a ring structure including holes 22 having a second set of x and y dimensions, and so forth. While square holes are shown, the use of any other shaped hole 22 is envisioned. In an example, the dimension of each hole 22 can be: 13 mm≤x≤17 mm, and 8 mm≤y≤12 mm. In an example, the number of holes 22 in lower section 16 can be between 6 and 16.

FIG. 7 shows an example of ring structure 2 positioned in an example MPCVD chamber 20 that defines a resonating cavity 24 that is separated into a lower, plasma zone 26 and an upper zone 28 via a dielectric window 30 that allows microwaves 29 introduced via a microwave source 27 into upper zone 28 via a coaxial waveguide 32 to pass into plasma zone 26. An antenna 33 can be coupled to coaxial waveguide 32 and can be disposed in an opening 31 of dielectric window 30 as an aid in focusing microwaves 29 in plasma zone 26 for MPCVD growth of a diamond film 72 on growth substrate 10. A carbon bearing reactive gas mixture 34 can be introduced from a reactive gas mixture source 35 into plasma zone 26 in any desired manner, e.g., via a center conductor 36 of coaxial waveguide 32. A vacuum pump 37 in fluid communication with plasma zone 26 to reduce the pressure in plasma zone 26 to a suitable pressure for MPCVD growth of diamond film 72 on growth substrate 10. MPCVD growth of diamond film 72 on growth substrate 10 is well known in the art and will only be briefly described hereinafter.

Figure 8:
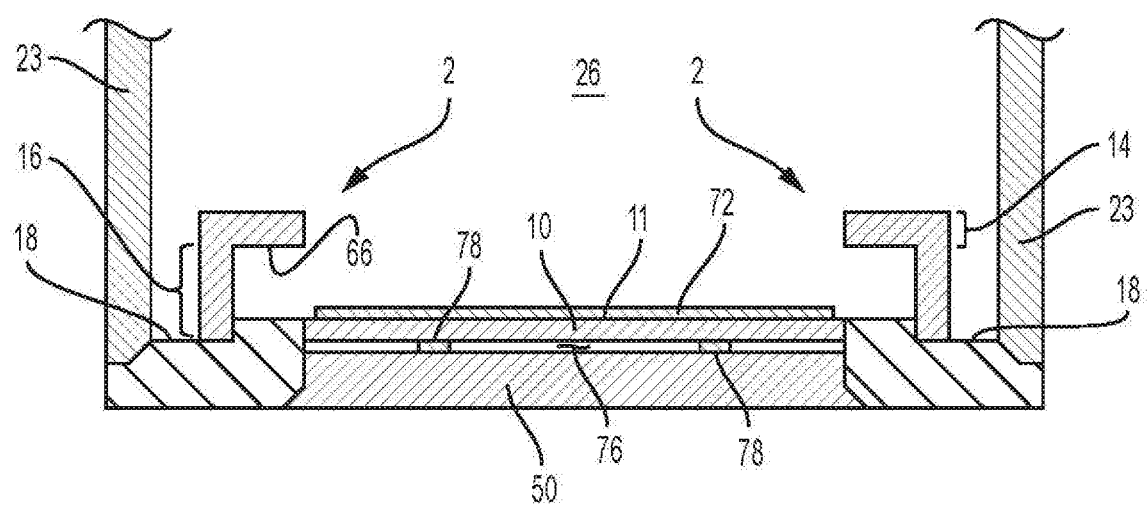
FIG. 8 is a cross-section of another example ring structure in relation to a bottom of a MPCVD chamber including a plurality of spacers which can be used to support growth substrate above the pedestal via a gap.

With reference to FIG. 8, in another example, ring structure 2, bottom 18 of MPCVD chamber 20, and a pedestal 50 (used to support growth substrate 10) can be assembled or formed as a unitary piece that allows for independent replacement of growth substrate 10 which is shown spaced from pedestal 50 via a gap 76 formed by spacers 78. A part of sidewall 23 and a part of plasma zone 26 of MPCVD chamber 20 are also shown in FIG. 8.

Figure 3B:
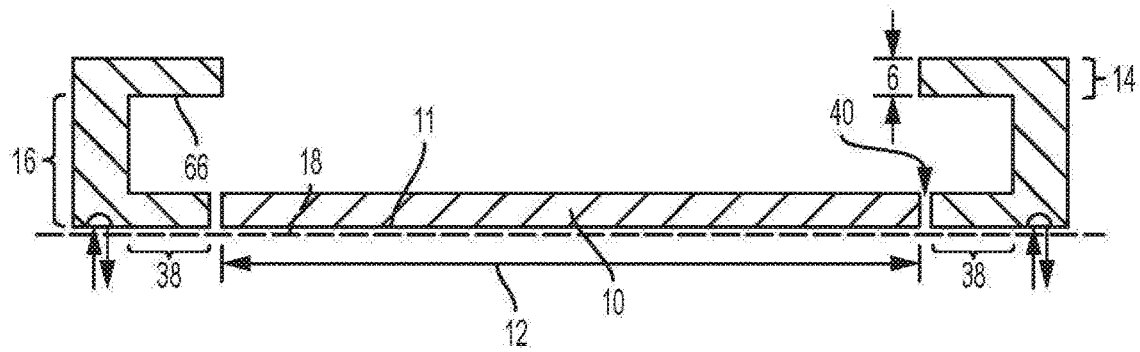
FIGS. 3(B)-3(D) are cross-sections of different example focusing ring structures that can be used in place of the example focusing ring structure shown in FIGS. 1 and 2.
Figure 3C:
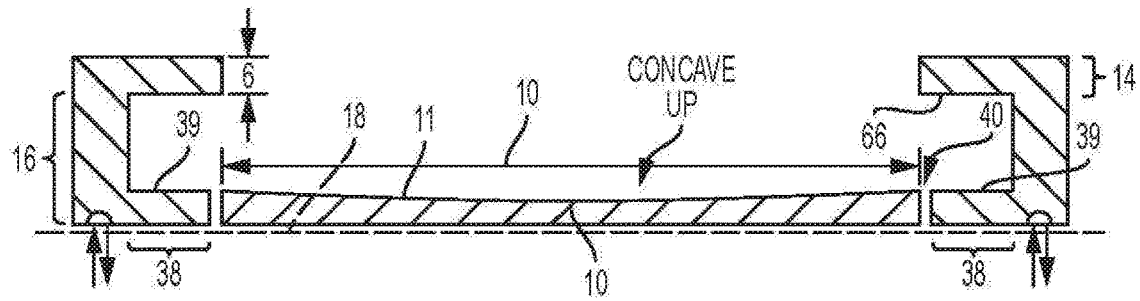
Figure 3D:
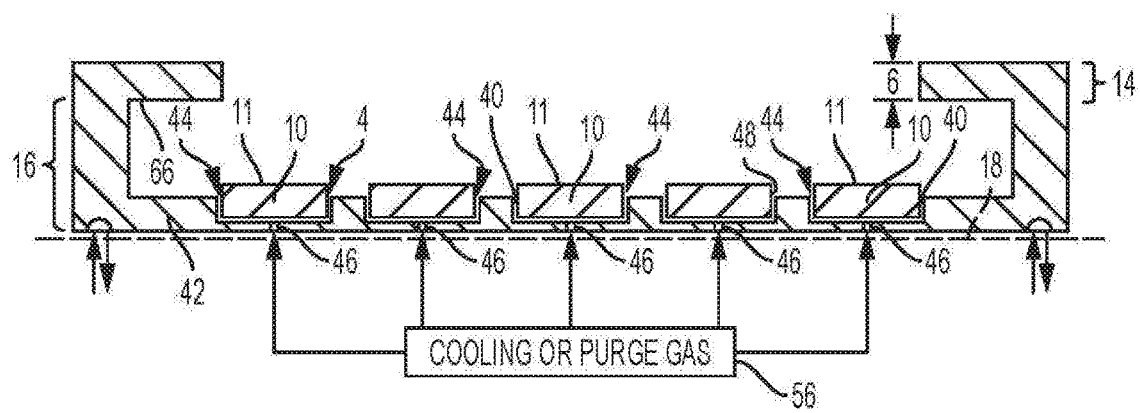

Other example ring structures 2 that may be useful in the diamond growth process are shown in FIGS. 3B-3D.

Controlling Diamond Growth Substrate Edge Environment:

During MPCVD growth of diamond film 72 on growth substrate 10, high intensity electric fields can form at a perimeter or edge of growth substrate 10. This, in combination with diamond film 72 overgrowth at the perimeter or edge of growth substrate 10, can lead to instability in the diamond film growth process—forcing dynamic changes growth conditions during MPCVD diamond film growth in order to maintain a consistent diamond film growth environment. By adding a base, ring-shaped section 38 (shown in FIG. 3(B)) to the lower section 16 of ring structure 2 shown in FIG. 3(A), whereupon the ring structure 2 shown in FIG. 3(B) has a square "C" shape, such that a gap 40 between base section 38 and growth substrate 10 is between 1-2 mm, one can reduce or eliminate the high intensity electric field at the perimeter or edge of growth substrate 10.

Controlling Gas Environments:

Bottom 18 of MPCVD chamber 20 can include ports 46 (FIG. 7) for introducing a cooling or purge gas or gas mixture from a cooling or purge fluid source 56 into gap 40 between growth substrate 10 and any example ring structure 2 described herein, to locally reduce the rate of the diamond film deposition at or proximate the perimeter or edge of growth substrate 10 to near zero, thereby effectively constraining the growth of diamond film 72 to the top surface 11 of growth substrate 10.

Deposition on Curved Surfaces:

If a curved surface is desired on a finished diamond film 72 (e.g., for use in domes or curved optics), a curved growth substrate 10 and, optionally, a curved focusing ring base section 38 can be used. In an example shown in FIG. 3(C), surface 11 of growth substrate 10 can be curved, e.g., concave up, with a desired curved cross-section and ring structure 2 can optionally be configured as shown in FIG. 3(C) such that a cross-section of top surface 39 of base section 38 is angled or curved in a way to continue the concavity of growth substrate 10. In this example, gap 40 between the base section 38 and growth substrate 10 can be between 1-2 mm and a cooling or purge gas or gas mixture can optionally be flowed into gap 40 to constrain the growth of diamond film 72 to top surface 11 of growth substrate 10.

As with the example of ring structure 2 shown in FIG. 3(A), holes 22 on the lower, vertical section 16 of any example ring structure 2 described herein can be used to target a specific resonant frequency within MPCVD chamber 20.

Deposition Across Large Number of Discrete Substrates:

If the need is to apply a diamond film 72 on a large number of small substrates, a ring structure 2 can include substrate pedestal that can be configured to accommodate a large number of small growth substrates 10. In an example shown in FIG. 3(D), ring structure 2 can include a base section 42 (substrate pedestal) coupled to or integral with a lower part of lower section 16. In an example, base section 42 can include a number of recesses 44 configured to receive a like number of growth substrates 10 for MPCVD deposit of diamond films on said growth substrates 10. In an example, gas delivery ports 46 (at least one beneath each growth substrate 10), can be used to supply a cooling or purge gas or gas mixture underneath each growth substrate 10 independently to thereby supply said cooling or purge gas or gas mixture to the gap 48 between each growth substrate 10 and the wall of the corresponding recess 44 to constrain the growth of the diamond film to a top surface 11 of said growth substrate 10. Each growth substrate 10 can be spaced from a bottom of its corresponding recess 44 by one or more spacers (not shown).

Figure 9:
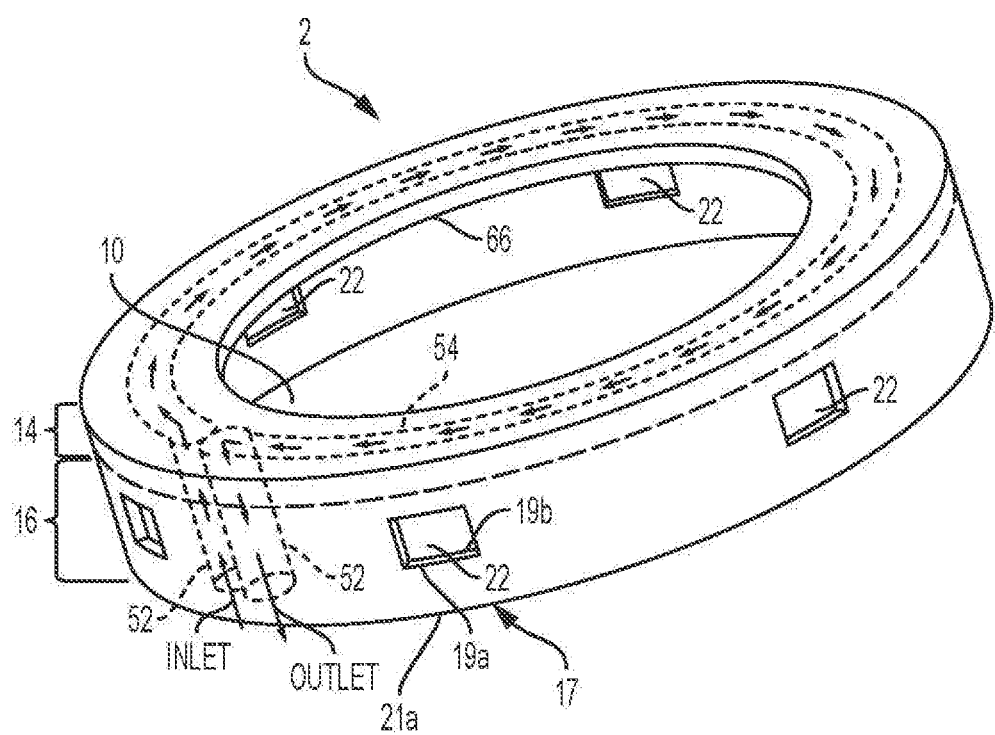
FIG. 9 is another example ring structure that can be utilized in an MPCVD chamber, wherein the ring structure includes a cooling channel in an upper section and a pair of gas ports in a lower section for introducing and removing a cooling or purging fluid (liquid or gas) from the cooling channel.
Figure 10:
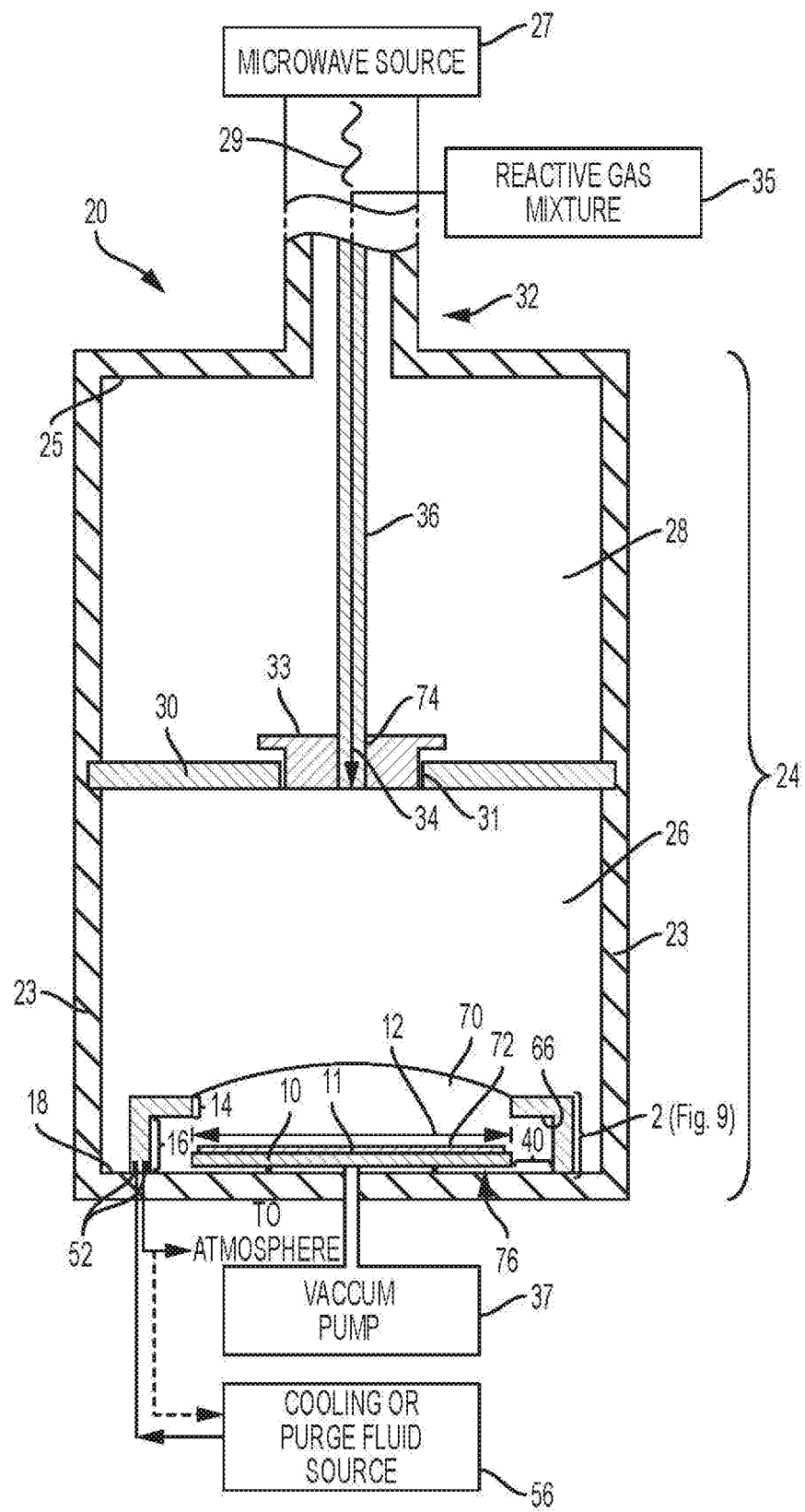
FIG. 10 is a schematic cross-section of an MPCVD reactor comprising an MPCVD chamber including the example ring structure shown in FIG. 9, with the gas ports coupled to a cooling or purge fluid source.

Referring to FIGS. 9 and 10, another example ring structure 2, shown in isolation in FIG. 9, can include a cooling channel 54 (shown in phantom) in upper section 14 that is fluid communication with a pair of ports 52 (shown in phantom) that extend through lower section 16 and are open at bottom 17 of lower section 16 of said ring structure 2. As shown in FIG. 10, one of said pair of ports 52 can be coupled to receive a cooling or purge fluid (liquid or gas) or mixture from cooling or purge fluid source 56. The other of said pair of ports 52 can be vented to atmosphere or (as shown in phantom in FIG. 10) or can be coupled to return the cooling or purge fluid or mixture to cooling or purge fluid source 56 after passage of the cooling or purge fluid or mixture through cooling channel 54. In an example, cooling channel 54 can be a closed loop channel whereupon fluid introduced into one port 52 will travel through cooling channel 54 in one direction and exit the other port 52. However, this is not to be construed in a limiting sense since it is envisioned that any manner of cooling ring structure 2 with a cooling or purge fluid (liquid or gas) or mixture can be utilized. Cooling channel 54 and ports 52 can also be used with any example ring structures 2 described herein.

The example ring structure 2 shown in FIG. 9 has square holes 22 in lower section 16. Reference numbers 19*a*, 19*b* and 21*a* shown in FIG. 2 are also shown in FIG. 9 to illustrate the relationship of the solid part of lower section 16 shown in phantom in FIG. 2 to an actual representation of the solid part of lower section 16 in FIG. 9.

FIGS. 7 and 10 show cooling or purge fluid source 56 supplying a cooling or purge gas or gas mixture to gap 40 (FIG. 7) and a cooling or purge fluid (gas or liquid) or mixture to cooling channel 54 via ports 52 (in FIG. 10), respectively, independent of each other. However, this is not to be construed in a limiting sense since it is envisioned that the cooling or purge gas or gas mixture and the cooling or purge fluid or mixture can be supplied to gap 40 and cooling channel 54 at the same time. Moreover, the illustration and description of a single cooling or purge fluid source 56 for supplying a cooling or purge gas or gas mixture to gap 40 (FIG. 7) and a cooling or purge fluid (gas or liquid) or mixture to cooling channel 54 via ports 52 (in FIG. 10), respectively, is not to be construed in a limiting sense since it is envisioned that separate sources can be used.

Figure 11A:
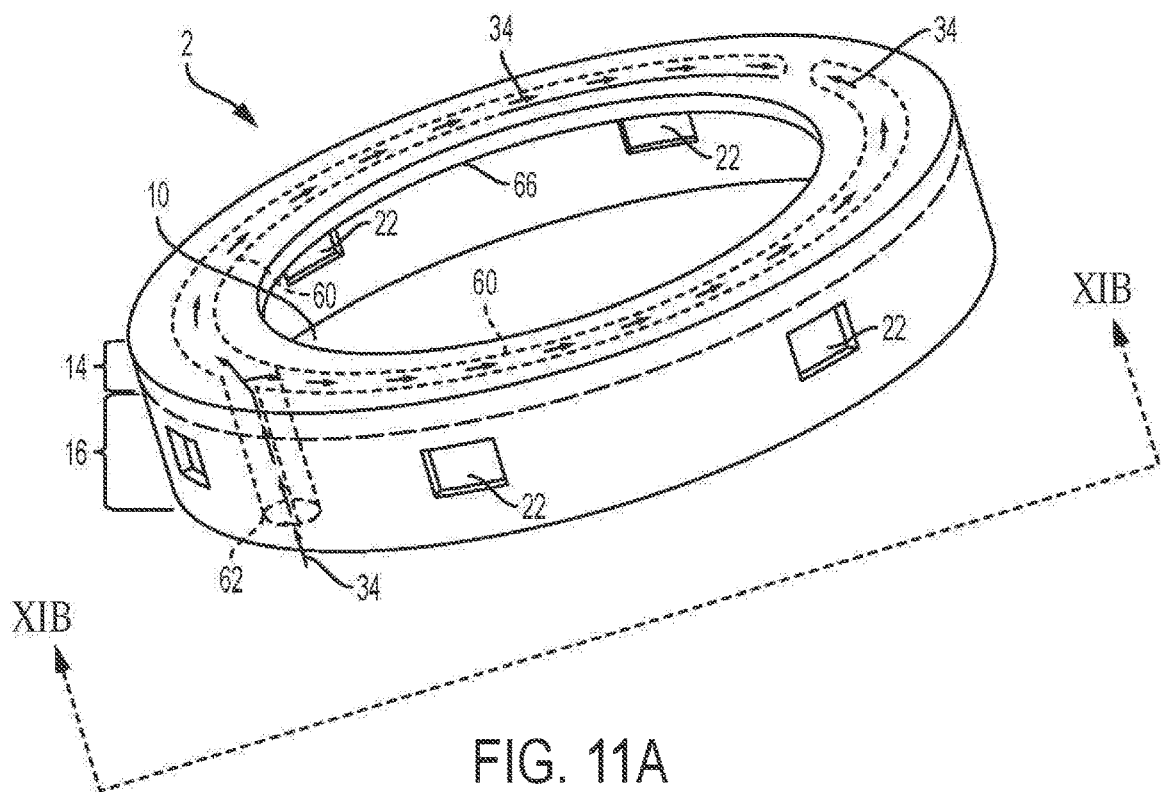
FIGS. 11(A) and 11(B) are isolated perspective and isolated bottom-up views of another example ring structure including one or more channels and gas outlet ports for delivery of a reactive gas mixture from a reactive gas mixture source to an area proximate to or surrounding a perimeter of the growth substrate and/or along the top surface of the growth substrate.
Figure 11B:
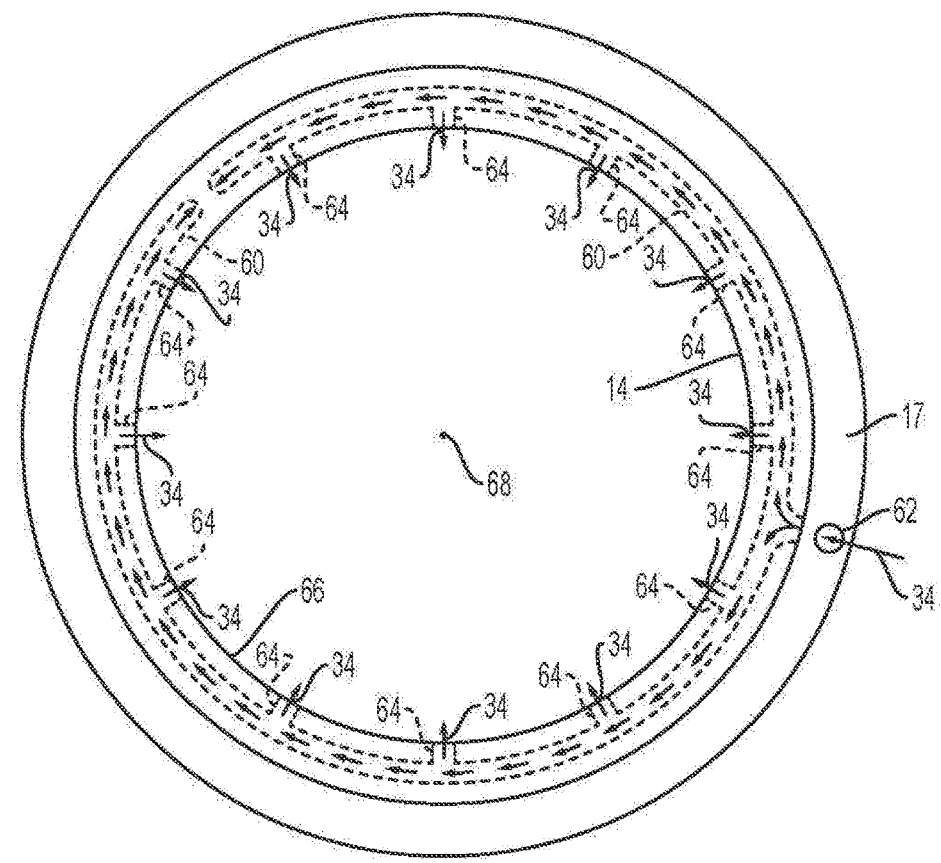
Figure 12:
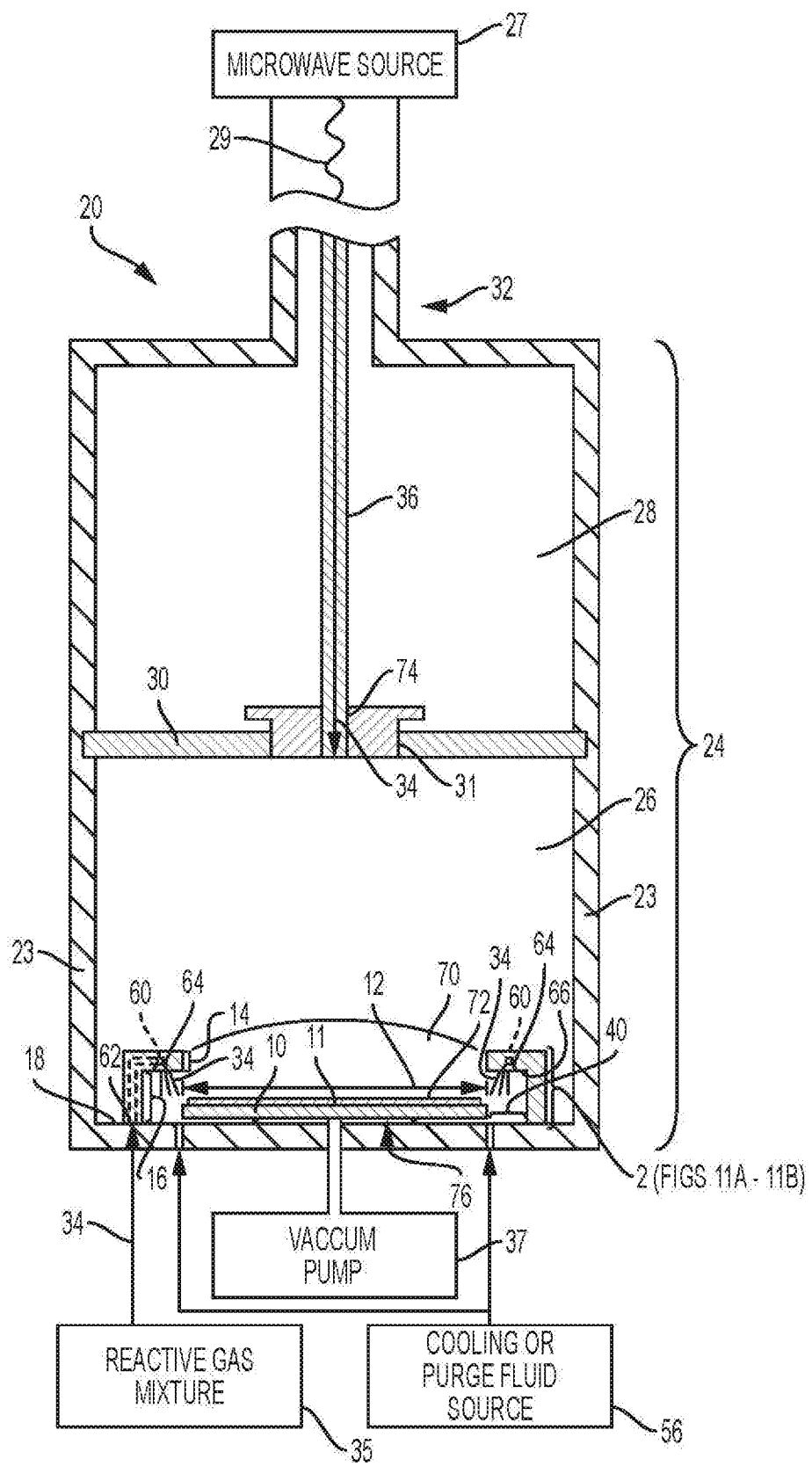
FIG. 12 is a schematic cross-section of an MPCVD reactor comprising an MPCVD chamber including the example ring structure shown in FIGS. 11(A)-11(B).

With reference to FIGS. 11(A), 11(B) and 12, another example ring structure 2, shown in isolated perspective view and isolated bottom-up view in FIGS. 11(A) and 11(B), respectively, can include one or more channels 60 (shown in phantom) for delivery of reactive gas mixture 34 from a reactive gas mixture source to a part of plasma zone 26 proximate to or surrounding the perimeter of growth substrate 10 and/or along the top surface 11 of growth substrate 10. The example ring structure 2 shown in FIGS. 11(A)-11(B) can be used also or alternatively to center conductor 36 of coaxial waveguide 32 for delivery of reactive gas mixture 34 into plasma zone 26 as shown, for example, in FIGS. 7 and 10.

The example ring structure 2 shown in FIGS. 11(A)-11(B) can include, for example, two channels 60 that can extend in opposite directions in upper section 14 from, for example, a single gas inlet port 62 that extends from upper section 14, through lower section 16 and is open at bottom 17 of lower section 16 of said ring structure 2 for receiving reactive gas mixture 34 via bottom 18 of MPCVD chamber 20, as shown in FIG. 12. The illustration and description of the example ring structure 2 shown in FIGS. 11(A)-11(B) including a single gas inlet port 62 and two channels 60 is not to be construed in a limiting sense since it is envisioned any number of gas inlet ports 62 and/or any number of channels 60 can be used to facilitate the delivery of reactive gas mixture 34 to the part of plasma zone 26 proximate to or surrounding the perimeter of growth substrate 10 and/or along the top surface 11 of growth substrate 10.

The bottom side 66 of upper section 14 of the example ring structure 2 shown in FIGS. 11(A)-11(B) can include a plurality of gas outlet ports 64 for delivery of reactive gas mixture 34 introduced into channels 60 via gas inlet port 62 to the part of plasma zone 26 proximate to or surrounding growth substrate 10 and/or along the top surface 11 of growth substrate 10. In an example, the total number of gas outlet ports 64, their shape, and spacing in radians or degrees about a central axis 68 of the example ring structure 2 shown in FIGS. 11(A)-11(B) can be selected by one skilled in the art for delivery of reactive gas mixture 34 to the part(s) of plasma zone 26 proximate to or surrounding growth substrate 10 and/or along the top surface 11 of growth substrate 10 in any suitable and/or desirable manner. In one non-limiting example, the number of gas outlet ports 64, their shape, and spacing can be selected to meet the objectives of enabling the efficient, thorough, and non-turbulent or laminar delivery of reactive gas mixture 34 to the part of plasma zone 26 proximate to or surrounding growth substrate 10 and/or along the top surface 11 of growth substrate 10. However, this is not to be construed in a limiting sense.

The example ring structure 2 shown in FIGS. 11(A)-11(B) includes, in an example, twelve gas outlet ports 64. However, this is not to be construed in a limiting sense. The gas outlet ports 64 can be evenly spaced or non-evenly spaced about central axis 68 to achieve one or more desired objectives for the delivery of reactive gas mixture 34 to the part of plasma zone 26 proximate to or surrounding growth substrate 10 and/or along the top surface 11 of growth substrate 10.

FIG. 12 shows delivery of reactive gas mixture 34 to the part of plasma zone 26 proximate to or surrounding growth substrate 10 and/or along the top surface 11 of growth substrate 10 independent of the delivery of cooling or purge gas or gas mixture to gap 40 and/or cooling or purge fluid or mixture to a cooling channel 54 (FIGS. 9 and 10). However, this is not to be construed in a limiting sense since it is envisioned that any combination of delivering reactive gas mixture 34 to the part of plasma zone 26 proximate to or surrounding growth substrate 10 or along the top surface 11 of growth substrate 10, the delivery of cooling or purge gas or gas mixture to gap 40 (FIG. 7), and/or the delivery of cooling or purge fluid or mixture to a cooling channel 54 can be accomplished by suitable combinations of the features of the various ring structures 2 disclosed herein.

In a method of growing diamond film 72 on growth substrate 10 utilizing any of the ring structures 2 disclosed herein, vacuum pump 37 evacuates plasma zone 26 while, simultaneously, a carbon-bearing reactive gas mixture 34 is introduced into plasma zone 26, e.g., via the interior of center conductor 36 and a conduit 74 of antenna 33 in a fluid communication with the interior of central conductor 36 or via the ring structure 2 shown in FIGS. 11(A)-11(B). The operation of vacuum pump 37 and the flow of reactive gas mixture 34 into plasma zone 26 is controlled so that plasma zone 26 is at a suitable pressure for the growth of diamond film 72 on growth substrate 10. At a suitable time after appropriate growth conditions have been established in plasma zone 26 by vacuum pump 37 and the flow of reactive gas mixture 34 into plasma zone 32, microwave source 27 introduces microwaves 29 into upper zone 28 of resonating cavity 24 via coaxial waveguide 32. Microwaves entering resonating cavity 24 initially propagate through upper zone 28 and then through annular window 30 into plasma zone 26. In plasma zone 26, the microwaves 29 react with the reactive gas mixture 34 to produce plasma 70 which causes the growth of diamond film 72 on growth substrate 10 in a manner known in the art.

Any example ring structure disclosed above can be utilized in the growth of diamond film 72 on growth substrate 10. For example, the ring structure 2 shown in FIGS. 1, 2 and 3(A) can be used; any of the ring structures shown in FIGS. 3(B)-3(D) can be used; the ring structure of FIG. 8 can be used; the ring structure of FIG. 9 can be used; or the ring structure of FIGS. 11(A)-11(B) can be used. Also, it is envisioned that any combination of the features of the various ring structures disclosed herein can be combined and utilized together. Accordingly, the description of each ring structure described above is not to be construed in a limiting sense since one or two or more of the features of one or two or more of the ring structures disclosed above can be combined in any manner deemed suitable and/or desirable by one of ordinary skill in the art. In an example, the ring structures 2 of FIGS. 9 and 11(A) illustrate closed holes or slots 22. However, it is envisioned that the ring structures 2 of FIGS. 9 and 11(A) can have open slots of the type shown in FIG. 2. Similarly, the ring structure 2 shown in FIG. 2 can have closed holes or slots 22 of the type shown, for example, in FIG. 9.

Moreover, any example ring structure disclosed herein can include one or a combination of cooling channel 54 and gas ports 52; along with channel 60, gas outlet ports 64 and gas inlet port 62. Accordingly, the combination of channels 54 and 60, along with ports 52, 60, and 64, in a single ring structure, is envisioned.

Moreover, in an example, growth substrate 10 can be spaced from bottom 18 of plasma chamber 26 by a gap 76 in any suitable and/or desirable manner, e.g., spacers 78.

Heretofore, in accordance with the teachings of the prior art, where a ring structure 2 of any type described herein is not used for growth of a diamond film, the diameter of an as-grown, high-quality diamond film MPCVD grown on a substrate in the MPCVD chamber was limited to $0.5\lambda$ of the microwave frequency used to grow the as-grown diamond film. Herein, a "high-quality diamond film" is considered to be a film that has a total thickness variation of <10%, <5%, or <1% and can also have one or more of the following:

a birefringence between 0-100 nm/cm, 0-80 nm/cm, or 0-20 nm/cm;
  a 10.6 μm bulk absorption <0.07 $cm^{-1}$, <0.055 $cm^{-1}$, or <0.04 $cm^{-1}$;
  a 1 μm scatter <0.9 $cm^{-1}$, <0.5 $cm^{-1}$, or <0.1 $cm^{-1}$;
  a 1 μm bulk absorption <0.1 $cm^{-1}$, <0.07 $cm^{-1}$, or <0.035 $cm^{-1}$; and
  a transmitted phase shift <0.6°, <0.3°, or 0.0°.

In contrast, the use of any ring structure 2 described herein is believed to enable the growth of an as-grown, high-quality diamond film having, in an example, a diameter desirably between $0.55\lambda$ and $1.0\lambda$, more desirably between $0.655\lambda$ and $1.0\lambda$, and most desirably between $0.76\lambda$ and $1.0\lambda$.

As can be seen, disclosed is a chemical vapor deposition (CVD) reactor comprising any combination of the features set forth in the following paragraphs: a resonating cavity configured to receive microwaves; a microwave transparent window disposed in the resonating cavity separating the resonating cavity into an upper zone and a plasma zone, wherein the resonating cavity is configured to propagate microwaves entering the upper zone through the microwave transparent window into the plasma zone; a substrate disposed proximate a bottom of the plasma zone opposite the microwave transparent window; and a ring structure disposed around a perimeter of the substrate in the plasma zone, the ring structure including a lower section that extends from the bottom of the resonating cavity toward the microwave transparent window and an upper section on a side of the lower section opposite the bottom of the resonating cavity, the upper section extending radially toward a central axis of the ring structure.

The substrate and ring structure can be positioned coaxially in the plasma zone. The upper section of the ring structure can have an inner diameter that is $\frac{5}{8}\lambda$ to $\frac{3}{4}\lambda$. The substrate can have an outer diameter that is $\frac{3}{4}\lambda$ to $\frac{7}{8}\lambda$. "λ" is a wavelength of the microwave frequency that the resonating cavity is designed for use with.

The substrate can include a top surface that faces the microwave transparent window. The upper section of the ring structure can be positioned in the plasma zone at a height in the plasma zone that is between the top surface of the substrate and the microwave transparent window.

In one example, a bottom side of the upper section of the ring structure can be positioned $\geq \frac{1}{8}\lambda$ from the bottom of the resonating cavity. In another example, the bottom side of the upper section of the ring structure can be positioned $\geq \frac{3}{16}\lambda$ from the bottom of the resonating cavity.

The upper section of the ring structure can include including a channel in fluid communication with a fluid source that is operative for supplying a fluid to the channel.

The lower section of the ring structure can include a first port for supplying the fluid received from the fluid source to the channel and can include a second port for exhausting from the channel the fluid introduced into the channel via the first port.

The lower section of the ring structure can include a port for supplying gaseous fluid received from the fluid source to the channel. The upper section can include a plurality of gas outlet ports for exhausting the gaseous fluid introduced into the channel via the port to a space proximate to or surrounding the substrate, along a top surface of the substrate, or both.

The lower section of the ring structure can include a plurality of holes or slots. Each hole or slot can extend between the upper section of the ring structure and a bottom of the lower section of the ring structure. Each hole or slot can be open at the bottom of the lower section of the ring structure.

The CVD reactor can include a coaxial waveguide configured to feed the microwaves from a microwave source into the upper chamber. The coaxial waveguide can include a center conductor that extends into the upper zone. An end of the center conductor in the upper zone can be coupled to the microwave transparent window. The end of the center conductor in the upper zone can be coupled to the microwave transparent window via an antenna. The antenna can be disposed in an opening in the microwave transparent window.

The ring structure can include a base section between a perimeter of the substrate and the lower section of the ring structure proximate the bottom of the resonating chamber. The base section can be integral with the lower section of the ring structure and spaced from the perimeter of the substrate.

In cross-section, one side of the ring structure can have a "[" shape, or a square "C" shape.

A surface of the substrate facing the microwave transparent window can be concave. A surface of the base section facing the microwave transparent window can continue the concavity of the surface of the substrate facing the microwave transparent window.

The ring structure can include a base section integral with the lower section of the ring structure. The base section can include a plurality of recesses configured to receive a like plurality of substrates.

In cross-section, the ring structure can have a "[_____]" shape.

The CVD reactor can include means for introducing a cooling or purge gas into the plasma zone proximate a perimeter of the substrate. The means for introducing the cooling or purge gas can include one or more gas ports disposed in the bottom of the plasma zone.

The substrate can be spaced from the bottom of the resonating cavity.

In cross-section, one side of the ring structure can have an inverted "L" shape.

Also disclosed herein is a method of microwave plasma CVD growth of a diamond film comprising: (a) providing the CVD reactor of any of the above paragraphs; (b) feeding a carbon bearing reactive gas into the plasma zone; and (c) concurrent with step (b), feeding microwaves into the resonant cavity thereby forming in the plasma zone a plasma that causes a diamond film to form on a surface of the substrate that faces the microwave transparent window.

The method can include: (d), concurrent with step (c), evacuating the plasma zone to a pressure lower than the upper zone.

The method can include: (d), concurrent with step (c), feeding a cooling or purge gas into the plasma zone proximate a perimeter of the substrate.

For frequencies of microwaves of 2.45 GHz, 915 MHz, and 433 MHz, $\lambda=122.4$ mm, 328 mm, and 693 mm, respectively.

Example dimensions of each focusing ring 2 include:
lower section 16: inside diameter=$7/8\pm1/8\lambda$; outside diameter=$1\pm1/8\lambda$; and height (to the bottom side 66 of upper section 14)=$1/8\lambda$;
upper section 14: inside diameter=$5/8$ to $3/4\lambda$; outside diameter=$1\pm1/8\lambda$; and thickness=$1/8$ to $3/16\lambda$;
base section 38: inside diameter $7/8\lambda$; outside diameter=$1\pm1/8\lambda$; and thickness 10-13 mm;
each hole or slot 22: width (x) 13-17 mm; height (y) 8-12 mm.

The substrate where diamond growth occurs can have a diameter between $3/4$-$7/8\lambda$.

Finally, disclosed herein is an as-grown diamond film grown by MPCVD. Said as-grown diamond film comprises: a diameter desirably between $0.55\lambda$ and $1.0\lambda$, more desirably between $0.655\lambda$ and $1.0\lambda$, and most desirably between $0.76\lambda$ and $1.0\lambda$; a total thickness variation of <10%, <5%, or <1%; and one or more of the following: a birefringence between 0-100 nm/cm, 0-80 nm/cm, or 0-20 nm/cm; a 10.6 μm bulk absorption <0.07 $cm^{-1}$, <0.055 $cm^{-1}$, or <0.04 $cm^{-1}$; a 1 μm scatter <0.9 $cm^{-1}$, <0.5 $cm^{-1}$, or <0.1 $cm^{-1}$; a 1 μm bulk absorption <0.1 $cm^{-1}$, <0.07 $cm^{-1}$, or <0.035 $cm^{-1}$; and a transmitted phase shift <0.6°, <0.3°, or 0.0°, wherein $\lambda$ is a wavelength of the microwave frequency used to MPCVD grow the as-grown diamond film.

The examples have been described with reference to the accompanying figures. Modifications and alterations will occur to others upon reading and understanding the foregoing examples. Accordingly, the foregoing examples are not to be construed as limiting the disclosure.

The invention claimed is:

1. A chemical vapor deposition (CVD) reactor comprising:
a microwave resonating cavity configured to receive microwaves and sized to resonate said microwaves;
a microwave transparent window disposed in the resonating cavity separating the resonating cavity into an upper zone and a plasma zone, wherein the resonating cavity is configured to propagate microwaves entering the upper zone through the microwave transparent window into the plasma zone;
a substrate disposed proximate a bottom of the plasma zone opposite the microwave transparent window;
a ring structure disposed around a perimeter of the substrate in the plasma zone, the ring structure including a lower section that extends from the bottom of the resonating cavity toward the microwave transparent window and an upper section on a side of the lower section opposite the bottom of the resonating cavity, the upper section extending radially toward a central axis of the ring structure to an upper section inner diameter, wherein the lower section has an inner surface at a lower section inner diameter and an outer surface at a lower section outer diameter and the upper section inner diameter is less than the lower section inner diameter; and
a plurality of holes or slots, each of the plurality of holes or slots extending between the inner surface and the outer surface.

2. The CVD reactor of claim 1, wherein:
the substrate and ring structure are positioned coaxially in the plasma zone; and
the upper section of the ring structure has an inner diameter that is $5/8\lambda$ to $3/4\lambda$, wherein "$\lambda$" is a wavelength of the frequency of the microwaves with which the microwave resonating cavity is sized for use.

3. The CVD reactor of claim 2, wherein the substrate has an outer diameter that is $3/4\lambda$ to $7/8\lambda$.

4. The CVD reactor of claim 2, wherein for frequencies of microwaves of 2.45 GHz, 915 MHz, and 433 MHz, $\lambda=122.4$ mm, 328 mm, and 693 mm, respectively.

5. The CVD reactor of claim 1, wherein:
the substrate includes a top surface that faces the microwave transparent window; and
the upper section of the ring structure is positioned in the plasma zone at a height that is between the top surface of the substrate and the microwave transparent window.

6. The CVD reactor of claim 1, wherein the upper section of the ring structure is positioned $\geq 3/16\lambda$ away from the bottom of the microwave resonating cavity, wherein "$\lambda$" is a wavelength of the frequency of the microwaves with which the microwave resonating cavity is sized for use.

7. The CVD reactor of claim 1, further including the upper section of the ring structure including a channel in fluid communication with a fluid source that is operative for supplying a fluid to the channel.

8. The CVD reactor of claim 7, further including the lower section of the ring structure including a first port for supplying the fluid received from the fluid source to the channel and a second port for exhausting from the channel the fluid introduced into the channel via the first port.

9. The CVD reactor of claim 7, wherein:
the lower section of the ring structure includes a port for supplying gaseous fluid received from the fluid source to the channel; and
the upper section includes a plurality of gas outlet ports for exhausting the fluid introduced into the channel via the first port to a space surrounding the substrate, along a top surface of the substrate, or both.

10. The CVD reactor of claim 1, wherein one or more hole or slot extends between the upper section of the ring structure and a bottom of the lower section of the ring structure.

11. The CVD reactor of claim 10, wherein one ore more hole or slot is open at the bottom of the lower section of the ring structure.

12. The CVD reactor of claim 1, further including a coaxial waveguide configured to feed the microwaves from a microwave source into the upper chamber, wherein the coaxial waveguide includes a center conductor that extends into the upper zone, wherein an end of the center conductor in the upper zone is coupled to the microwave transparent window.

13. The CVD reactor of claim 12, further including an antenna, wherein the end of the center conductor in the upper zone is coupled to the microwave transparent window via the antenna.

14. The CVD reactor of claim 13, wherein the antenna is disposed in an opening in the microwave transparent window.

15. The CVD reactor of claim 1, wherein:
the ring structure includes a base section between a perimeter of the substrate and the lower section of the ring structure proximate the bottom of the microwave resonating chamber; and
the base section is integral with the lower section of the ring structure and spaced from the perimeter of the substrate.

16. The CVD reactor of claim 15, wherein a surface of the substrate facing the microwave transparent window is concave.

17. The CVD reactor of claim 16, wherein a surface of the base section facing the microwave transparent window continues the concavity of the surface of the substrate facing the microwave transparent window.

18. The CVD reactor of claim 1, wherein:
the ring structure includes a base section integral with the lower section of the ring structure; and
the base section includes a plurality of recesses configured to receive a like plurality of substrates.

19. The CVD reactor of claim 18, wherein, in cross-section, the ring structure has a "[_____]" shape.

20. The CVD reactor of claim 1, including means for introducing a cooling or purge gas into the plasma zone proximate a perimeter of the substrate.

21. The CVD reactor of claim 20, wherein the means for introducing the cooling or purge gas includes one or more gas ports disposed in the bottom of the plasma zone.

22. The CVD reactor of claim 1, wherein the substrate is spaced from the bottom of the microwave resonating cavity.

23. The CVD reactor of claim 1, wherein, in cross-section, one side of the ring structure has an inverted "L" shape.

24. The CVD reactor of claim 1, wherein the microwaves have a wavelength greater than or equal to about 122.4 mm to less than or equal to about 693 mm.

25. The CVD reactor of claim 24, wherein the microwaves have a wavelength of at least one of about 122.4 mm, about 328 mm, and about 693 mm.

26. The CVD reactor of claim 1, wherein each of the plurality of holes or slots extend from the inner surface to the outer surface.

27. The CVD reactor of claim 1, wherein the lower section extends from the bottom of the resonating cavity toward the microwave transparent window to a height higher than the substrate.

28. The CVD reactor of claim 27, wherein the height is about $\frac{1}{8}\lambda$, wherein "$\lambda$" is a wavelength of the frequency of the microwaves with which the microwave resonating cavity is sized for use.

29. A chemical vapor deposition (CVD) reactor comprising:
a resonating cavity configured to receive microwaves;
a microwave transparent window disposed in the resonating cavity separating the resonating cavity into an upper zone and a plasma zone, wherein the resonating cavity is configured to propagate microwaves entering the upper zone through the microwave transparent window into the plasma zone;
a substrate disposed proximate a bottom of the plasma zone opposite the microwave transparent window; and
a ring structure disposed around a perimeter of the substrate in the plasma zone, the ring structure including a lower section that extends from the bottom of the resonating cavity toward the microwave transparent window and an upper section on a side of the lower section opposite the bottom of the resonating cavity, the upper section extending radially toward a central axis of the ring structure,
wherein the upper section of the ring structure including a channel in fluid communication with a fluid source that is operative for supplying a fluid to the channel, the lower section of the ring structure includes a port for supplying gaseous fluid received from the fluid source to the channel, and the upper section includes a plurality of gas outlet ports for exhausting the fluid introduced into the channel via the first port to a space surrounding the substrate, along a top surface of the substrate, or both.

30. A chemical vapor deposition (CVD) reactor comprising:
a resonating cavity configured to receive microwaves;
a microwave transparent window disposed in the resonating cavity separating the resonating cavity into an upper zone and a plasma zone, wherein the resonating cavity is configured to propagate microwaves entering the upper zone through the microwave transparent window into the plasma zone;
a substrate disposed proximate a bottom of the plasma zone opposite the microwave transparent window; and
a ring structure disposed around a perimeter of the substrate in the plasma zone, the ring structure including a lower section that extends from the bottom of the resonating cavity toward the microwave transparent window and an upper section on a side of the lower section opposite the bottom of the resonating cavity, the upper section extending radially toward a central axis of the ring structure,
wherein the lower section of the ring structure includes a plurality of holes or slots, each hole or slot extending between the upper section of the ring structure and a bottom of the lower section of the ring structure, and wherein each hole or slot is open at the bottom of the lower section of the ring structure.

* * * * *